United States Patent [19]
Kim

[11] Patent Number: 5,774,407
[45] Date of Patent: Jun. 30, 1998

[54] DRAM BIT LINE SELECTION CIRCUIT FOR SELECTING MULTIPLE PAIRS OF LINES

[75] Inventor: Sam Soo Kim, Seoul, Rep. of Korea

[73] Assignee: LG Semicon Co., Ltd., Chungcheongbuk-Do, Rep. of Korea

[21] Appl. No.: 738,707

[22] Filed: Oct. 28, 1996

[30] Foreign Application Priority Data

Dec. 27, 1995 [KR] Rep. of Korea .................. 1995-58903

[51] Int. Cl.$^6$ .................................................. G11C 8/00
[52] U.S. Cl. .............................. 365/230.03; 365/189.11; 365/207; 365/208
[58] Field of Search ......................... 365/230.03, 189.11, 365/207, 208

[56] References Cited

U.S. PATENT DOCUMENTS

| | | | |
|---|---|---|---|
| 5,267,214 | 11/1993 | Fujishima et al. | 365/230.03 |
| 5,361,233 | 11/1994 | Kotani | 365/207 |
| 5,473,576 | 12/1995 | Matsui | 365/230.06 |
| 5,477,498 | 12/1995 | Ooishi | 365/208 |
| 5,640,363 | 6/1997 | Furutani et al. | 365/233.5 |

*Primary Examiner*—David C. Nelms
*Assistant Examiner*—Hien Nguyen
*Attorney, Agent, or Firm*—Morgan, Lewis & Bockius LLP

[57] ABSTRACT

A DRAM bit line selection circuit for selecting multiple pairs of bit lines connecting a bidirectional sense amplifier and a cell array having at least two blocks, the bit line selection circuit includes a block selecting circuit for receiving block selection coding signals corresponding to each block, generating a first signal corresponding to a selected block and a second signal corresponding to a non-selected block, and maintaining the first signal and the second signal until a non-selected block is selected; a level transition unit for outputting a transition signal having one of a first level and a second level in response to an output from the block selecting circuit; and a bit line selecting signal generating unit for generating a bit line selecting signal in response to the transition signal of the level transition unit, wherein the bit line selecting signal corresponding to the selected block maintains the first level, and changes to a third level when the non-selected block is selected.

17 Claims, 7 Drawing Sheets

DRAM BIT LINE SELECTION CIRCUIT FOR SELECTING MULTIPLE PAIRS OF LINES

BACKGROUND OF THE INVENTION

1. Field of the Invention

The present invention relates to a DRAM bit line selection circuit, and more particularly, to a DRAM bit line selection circuit which uses a bidirectional sense amplifier.

2. Discussion of the Related Art

Figure 1A:
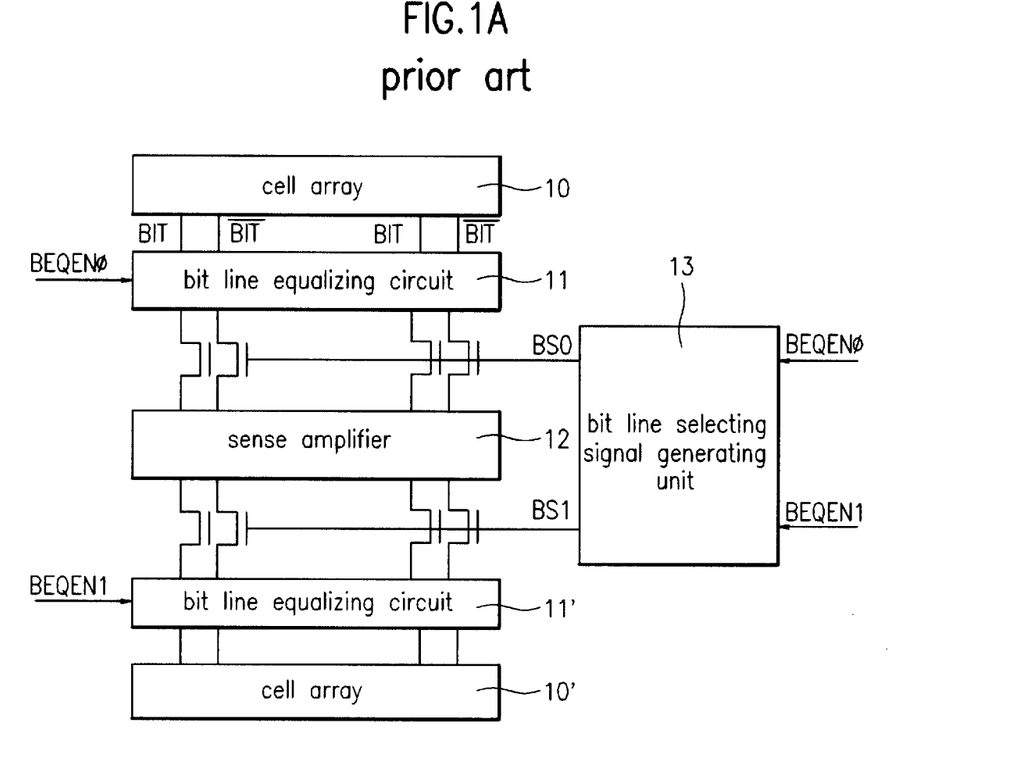
FIG. 1A is a circuit diagram showing a DRAM sensing system using a bidirectional sense amplifier.

As illustrated in FIG. 1A, a conventional DRAM sensing system includes a bidirectional sense amplifier 12, two block cell arrays 10 and 10' each arranged on one side of the bidirectional sense amplifier 12 for connecting a pair of bit lines Bit and $\overline{\text{Bit}}$, two equalizing circuits 11 and 11' for equalizing each pair of bit lines Bit and $\overline{\text{Bit}}$, and a bit line selecting signal generating unit 13 for generating the bit line selecting signals BS0 and BS1. The bit line selecting signals BS0 and BS1 selectively drive a set of nMOS transistors connected to the pair of bit lines for connecting one of the two cell array blocks (10 and 10') to the bidirectional sense amplifier 12.

Figure 1B:
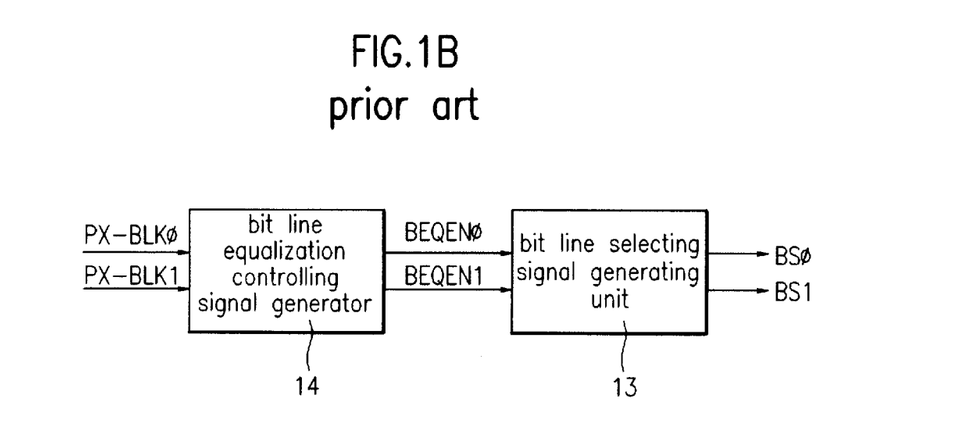
FIG. 1B is a schematical view illustrating a circuit for converting block selection coding signals.

As shown in FIG. 1B, a bit line equalization controlling signal generator 14 receives block selection coding signals PX-BLK0 and PX-BLK1 (generated in response to a row address signal), and generates block selecting signals BEQEN0 and BEQEN1. The block selecting signals BEQEN0 and BEQEN1 are then used as input to the bit line selecting signal generating unit 13.

Figure 2:
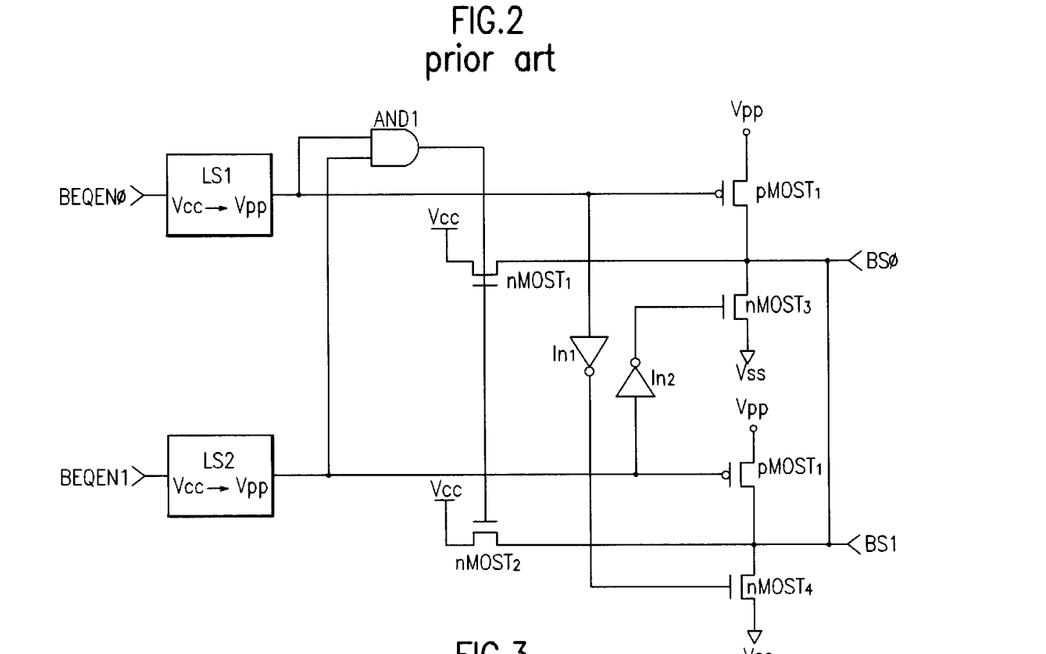
FIG. 2 is a detailed circuit diagram of a conventional bit line selection circuit.

As illustrated in FIG. 2, the bit line selecting signal generating unit 13 includes two level shifters LS1 and LS2, which respectively receive the block selecting signals BEQEN0 and BEQEN1, and shifts their voltage levels from Vcc to Vpp (Vpp=Vcc+Vth, Vth is a threshold voltage). An AND gate AND1 switches two nMOS transistors nMOST1 and nMOST2 by performing an AND operation with the outputs of the level shifters LS1 and LS2. In addition, the output of the level shifter LS1 is directly connected to the gate of a PMOS transistor PMOST1, and connected to the gate of an nMOS transistor nMOST4 via an inverter In1. The output of the level shifter LS2 is directly connected to the gate of a PMOS transistor PMOST2, and connected to the gate of an nMOS transistor nMOST3 via an inverter In2. The transistors PMOST1 and nMOST3 form a CMOS transistor, and transistors PMOST2 and nMOST4 form another CMOS transistor. The source terminals of transistors nMOST1 and nMOST2 are respectively connected to the output terminal of each CMOS transistor, thereby outputting the bit line selecting signals BS0 and BS1.

With reference to the signal converting circuit shown in FIG. 1B and the timing diagram shown in FIG. 3, the operation of the conventional DRAM bit line selection circuit will now be described.

The bit line equalization controlling signal generator 14 receives the block selection coding signals PX-BLK0 and PX-BLK1 at a time t1, and generates the block selecting signals (referred to as bit line controlling signals) BEQEN0 and BEQEN1.

When the block selecting signals BEQEN0 and BEQEN1 are at the high level, the level shifters LS1 and LS2 output the signal by shifting the voltage from Vcc to Vpp. The output signals of Vpp level from the level shifters LS1 and LS2 are connected respectively to the two input terminals of the AND gate AND1. As a result, a high level output signal from AND1 turns on the nMOS transistors nMOST1 and nMOST2. Meanwhile, the Vpp level output signals from the level shifters LS1 and LS2 are directly input to the gates of the PMOS transistors PMOST1 and PMOST2, and indirectly input to the gates of the nMOS transistors nMOST3 and nMOST4 through the inverters In1 and In2. As a result, the PMOS transistors (PMOST1 and PMOST2) and the nMOS transistors (nMOST3 and nMOST4) are all turned off. Accordingly, the bit line selecting signals BS0 and BS1 are both in the precharged state of Vcc level due to the turning on of the nMOS transistors nMOST1 and nMOST2.

Figure 3:
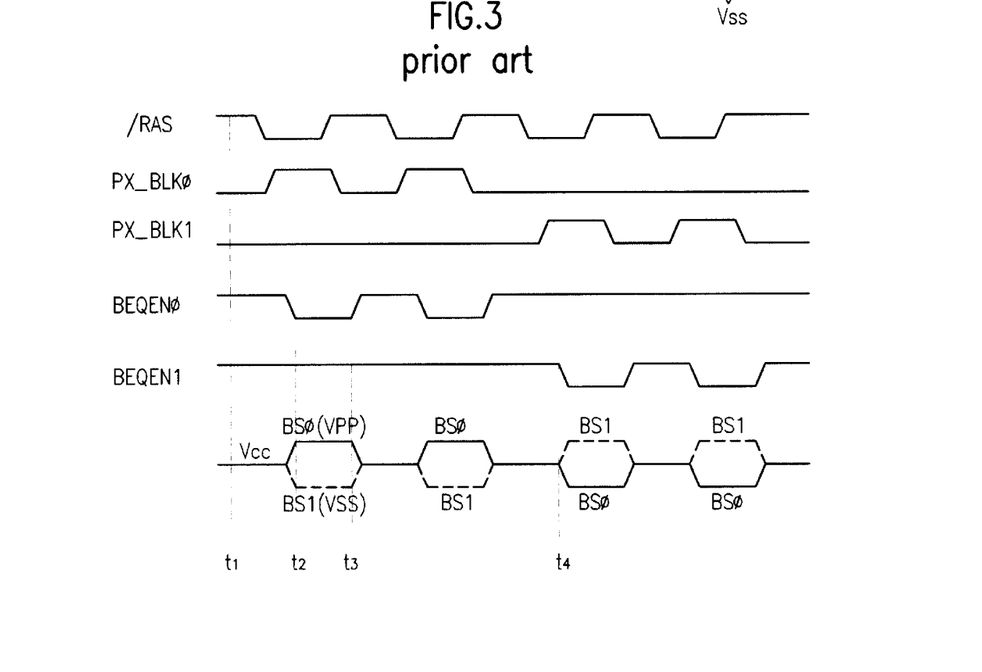
FIG. 3 is a timing diagram of the conventional bit line selection circuit.

Thereafter, the block selecting signal BEQEN0 becomes a low level at a time t2, as shown in FIG. 3. As a result, the output of the level shifter LS1 is at a Vcc level, thereby causing the output of the AND gate AND1 to be at a low level and the nMOS transistors nMOST1 and nMOST2 to be turned off.

In addition, when the signal having the Vcc level from the level shifter LS1 is applied through the gate of the nMOS transistor nMOST4 via the inverter In1, the PMOS transistor PMOST1 and the nMOS transistor nMOST4 are both turned on. Thus, the output BS0 is at a Vpp level, and the output BS1 is at a Vss level.

After the next block is selected, if its block selecting signal BEQEN0 is changed to a high level at a time t3 in response to a row address signal /RAS, the block selecting signals BEQEN0 and BEQEN1 are both changed to a high level. Therefore, the outputs BS0 and BS1 of the bit line selecting circuit are both in the precharged state of the Vcc level.

When the block selecting signal BEQEN1 changes to a low level at a time t4, the output of the level shifter LS2 changes from the Vpp level to the Vcc level. Similarly as illustrated above, the output of the AND gate AND1 becomes a low level, causing the nMOST transistors nMOST1 and nMOST2 to be turned off. Simultaneously, the signal of the Vcc level from LS2 is input to the PMOS transistor PMOST2 and to the nMOS transistor nMOST3 through inverter In2, causing the PMOS transistor PMOST2 and the nMOS transistor nMOST3 to be turned on. As a result, the outputs BS0 and BS1 of the bit line selecting circuit becomes Vss and Vpp levels, respectively.

However, the conventional circuit has the following problems. As described above, whenever the state of the row address signal /RAS changes, the states of the bit line selecting signals BS0 and BS1 also change. As a result, the bit line selecting signals BS0 and BS1 are repeatedly changing from a Vpp level to a Vcc level, or from a Vcc level to a Vss level, or in the reverse order. During these transition steps, a leakage current flows due to the Vpp voltage, causing an unnecessary consumption of power. Moreover, this problem predominates in a high capacitance or a high integration semiconductor device.

SUMMARY OF THE INVENTION

Accordingly, the present invention is directed to a low-power consumption DRAM bit line selection circuit that substantially obviates one or more of the problems due to limitations and disadvantages of the related art.

An object of the present invention is to provide a DRAM bit line selection circuit using a bidirectional sense amplifier with a reduced power consumption during level transition steps.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a low-power consumption DRAM bit line selection circuit for selecting multiple pairs of bit lines connecting a bidirectional sense amplifier and a cell array having at least two blocks, the DRAM bit line selection circuit includes: a block selecting circuit for receiving block selection coding signals corresponding to each block, generating a first signal corresponding to a selected block and a second signal corresponding to a non-selected block, and maintaining the first signal and the second signal until a non-selected block is selected; a level transition unit for outputting a level transition signal having one of a first level and a second level in response to an output from the block selecting circuit; and a bit line selecting signal generating unit for generating a bit line selecting signal in response to the level transition signal of the level transition unit, wherein the bit line selecting signal corresponding to the selected block maintains a first level, and changes to a third level when the non-selected block is selected.

In another aspect, according to the present invention, in a DRAM having a cell array divided into at least two blocks and connected to multiple pairs of bit lines and word lines, and at least one bidirectional sense amplifier connected to each cell of the cell array through a switching means respectively installed to the multiple pairs of bit lines, a bit line selection circuit for driving the switching means and then generating a bit line selecting signal in order to drive each pair of bit lines, the block selecting circuit of the invention includes: at least two pulse generating means for receiving a block selection coding signal, and then generating a pulse; signal level latching means for selecting the output of a pulse generating means to which a clock selection coding signal of the selected block of the pulse generating means is input, and then latching the selected output until the other block is selected; a level transition unit for transiting an output level from a first level to a second level, or from the second level to the first level in response to the output of the block selection circuit; and a selection signal generating unit for outputting the bit line selecting signal in response to the output of the transition unit.

In a further aspect, a DRAM sensing system of the present invention includes: a bidirectional sense amplifier; a cell array divided into at least two blocks; a switching unit and multiple pairs of bit lines coupling the bidirectional sense amplifier and the cell array; and a bit line selection circuit for driving the switching unit and the multiple pairs of bit lines. The bit line selection circuit includes: a block selecting circuit for receiving block selection coding signals corresponding to each block, generating a signal of high level corresponding to a selected block and a signal of low level corresponding to a non-selected block, and maintaining the signal of high level and the signal of low level until a non-selected block is selected; a level transition unit for outputting a transition signal having one of a first level and a second level in response to an output from the block selecting circuit; and a bit line selecting signal generating unit for generating a bit line selecting signal in response to the transition signal of the level transition unit, wherein the bit line selecting signal corresponding to the selected block maintains a first level, and changes to a third level when the non-selected block is selected.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4:
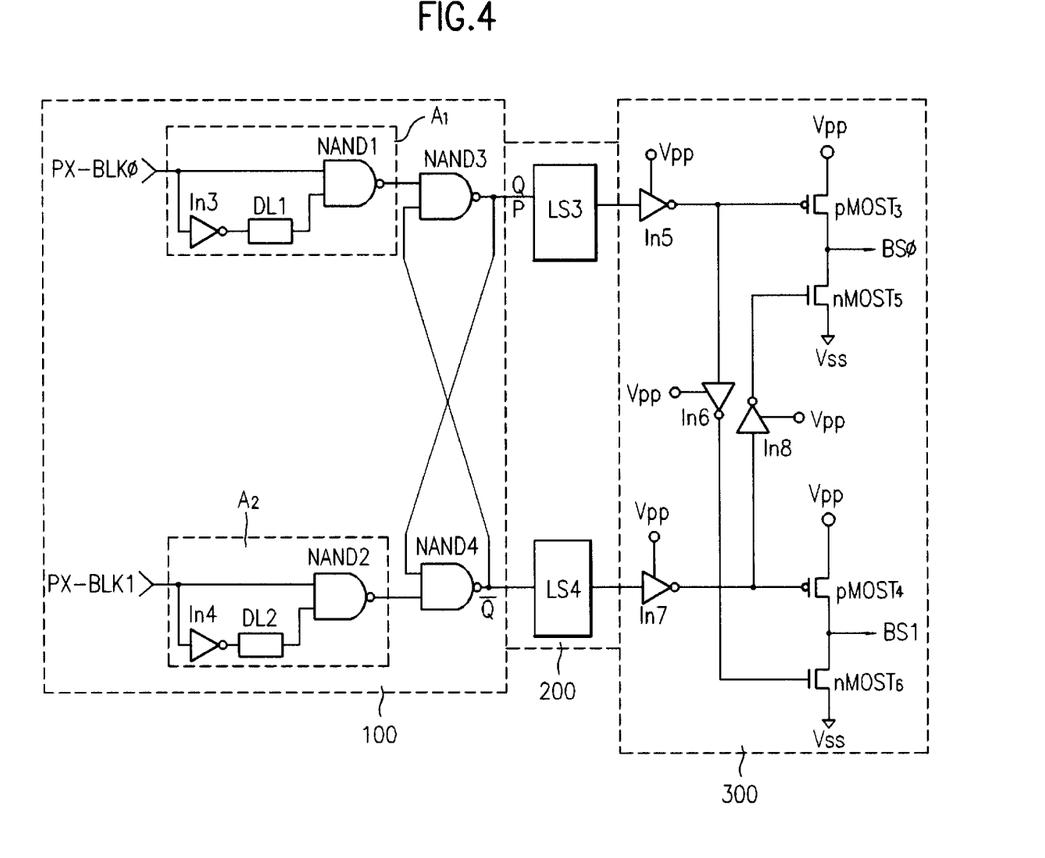
FIG. 4 illustrates a first embodiment of the present invention.
Figure 5:
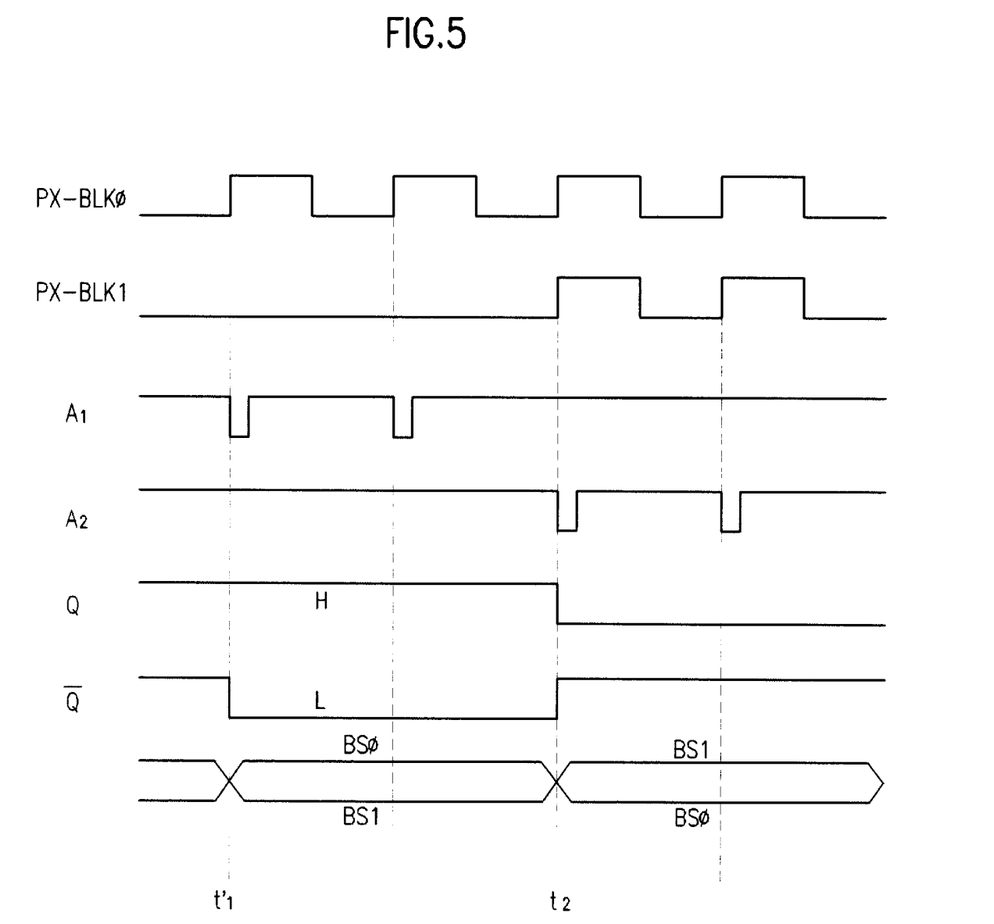
FIG. 5 is a timing diagram corresponding to the first embodiment of the invention.

FIG. 4 illustrates a first preferred embodiment of the present invention, and FIG. 5 shows a timing diagram corresponding to the first preferred embodiment. As shown in FIG. 4, the DRAM bit line selection circuit according to the first embodiment of the invention includes a block selecting circuit 100, a level transition unit 200 and a bit line selecting signal generating unit 300.

The block selecting circuit 100 includes two pulse generating circuits A1 and A2, and an NAND gate type latch circuit. The pulse generating circuit A1 includes an NAND gate NAND1 having one of its input terminals connected to the block selection coding signal PX-BLK0 and the other input terminal connected to the block selection coding signal PX-BLK0 via an inverter In3 and a delay circuit DL1. The pulse generating circuit A2 includes an NAND gate NAND2 having one of its input terminals connected to the block selection coding signal PX-BLK1 and the other input terminal connected to the block selection coding signal PX-BLK1 via an inverter In4 and a delay circuit DL2. The NAND gate type latch circuit includes two NAND gates NAND3 and NAND4 for latching the outputs from the pulse generating circuits A1 and A2.

The level transition unit 200 includes two level shifters LS3 and LS4 which change the voltages level of Vpp to Vcc, or Vcc to Vpp, in response to output signals Q and $\overline{Q}$ from the NAND gate type latch circuit.

The bit line selecting signal generating unit 300 includes two CMOS transistors. One CMOS includes a PMOS transistor PMOST3 and an nMOS transistor nMOST5, and the other CMOS includes a PMOS transistor PMOST4 and an nMOS transistor nMOST6. The output signal of the level shifter LS3 of the level transition unit 200 is applied to the gate of the PMOS transistor PMOST3 via an inverter In5, and simultaneously to the gate of the nMOS transistor nMOST6 via the inverter In5 and an inverter In6. The output signal of the level shifter LS4 is applied to the gate of the PMOS transistor PMOST4 via an inverter In7, and simultaneously to the gate of the nMOS transistor nMOST5 via the inverter In7 and an inverter In8. The inverters In5 through In8 are all for the voltage level of Vpp, and the swing of the CMOS is between Vpp and Vss.

With reference to FIG. 5, the operation of the first embodiment of the invention will now be described.

First, in response to a row address signal /RAS, the block selection coding signal PX-BLK0 of the selected block is at a high level, and the signal PX-BLK1 of the unselected block maintains a low level until it is selected.

In response to the input block selection coding signals PX-BLK0 and PX-BLK1, the pulse generating circuit A1 (see FIGS. 4 and 5) of the block selecting circuit generates a pulse (negative pulse) at a time t1, while the pulse generating circuit A2 maintains a high level as the block selecting signal PX-BLK1 stays at a low level. Accordingly, the output Q of the NAND gate NAND3 of the latch circuit is at a high level, and the output $\overline{Q}$ of the NAND gate NAND4 is at a low level. The output states of the latch circuit maintain the same levels until the pulse generating time t2 (which is in turn decided by the change of the block selection coding signal PX-BLK1). As a result, the output of the level shifter LS3 goes to the Vpp level, and the output of LS4 goes to the Vcc level in accordance with the output signals Q and $\overline{Q}$ of the block selecting circuit 100.

In the bit line selecting signal generating unit 300, the output BS0 is at the Vpp level and BS1 is at the Vss level because the PMOS transistor PMOST3 and nMOS transistor nMOST6 are turned on, and the nMOS transistor nMOST5 and PMOS transistor PMOST4 are turned off.

Referring to FIG. 1A, the output signals BS0 and BS1 turn on a switching device including nMOS transistors. The switching device is coupled to the bidirectional sense amplifier 12 and each pair of bit lines. As a result, the cell array placed in the upper part of FIG. 1A is connected to the bidirectional sense amplifier 12.

Referring to FIG. 5, once the block selection coding signal PX-BLK1 is selected at a time t2, the selected block selection coding signal PX-BLK1 becomes a high level corresponding to the row address signal /RAS, and the unselected block selection coding signal PX-BLK0 becomes a low level. Due to this change in input signals, the pulse generating circuit A1 of the block selecting circuit maintains its output at a high level, and the pulse generating circuit A2 generates a negative pulse. The output Q of the NAND gate NAND3 of the latch circuit becomes a low level, and the output $\overline{Q}$ of the NAND gate NAND4 becomes a high level.

The output of the level shifter LS3 reaches the Vcc level and the output of LS4 reaches the Vpp level in the level transition unit 200. Accordingly, the output BS0 of the bit line selecting signal generating unit 300 becomes a low level and the output BS1 becomes a high level. The pair of bit lines Bit and $\overline{Bit}$ of the cell array in the lower portion of FIG. 1A are connected to the bidirectional sense amplifier 12 through the switching device including nMOS transistors.

Accordingly, in the first embodiment of the present invention, the output BS0 (of the bit line selecting signal generating unit) corresponding to the selected block and BS1 corresponding to the unselected block maintain Vpp level and Vss level, respectively, regardless of a change in the row address signal /RAS, until the selected block is changed. Thus, the bit line selecting signals BS0 and BS1 do not change repeatedly between Vpp and Vcc, and Vcc and Vss in response to the row address signal /RAS, as in the conventional bit line selection circuit. This reduces the power consumption due to the leakage current when repeating the steps.

Figure 6:
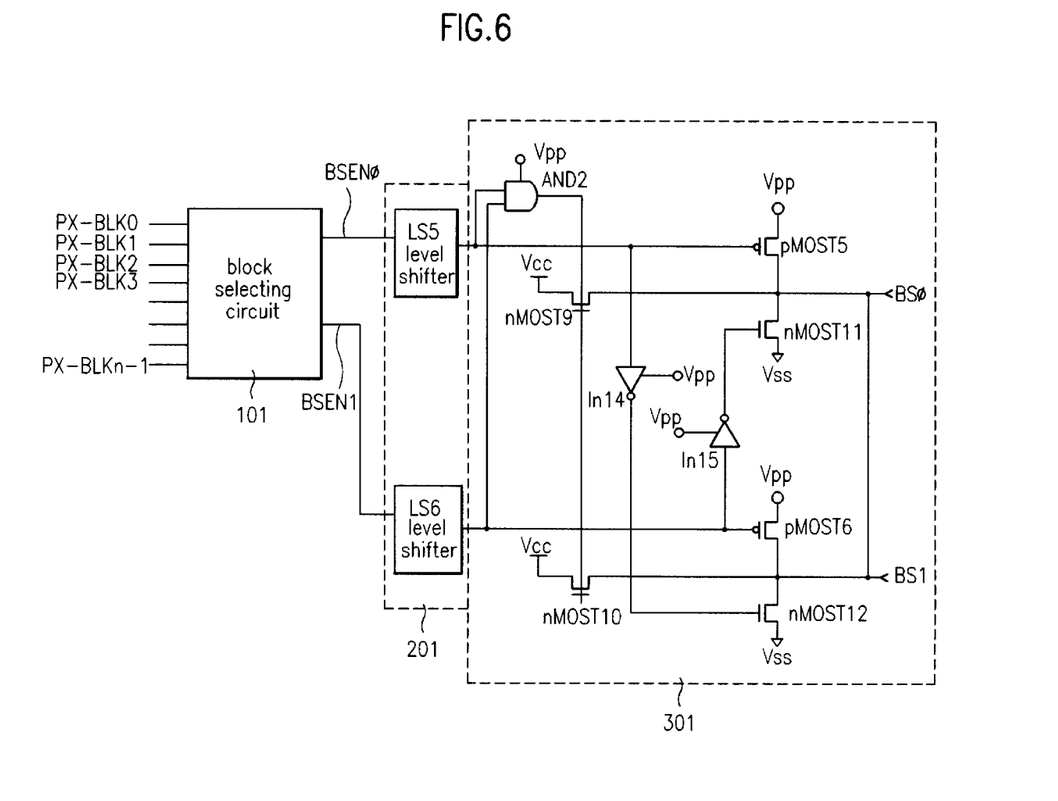
FIG. 6 illustrates a second embodiment of the present invention.
Figure 7:
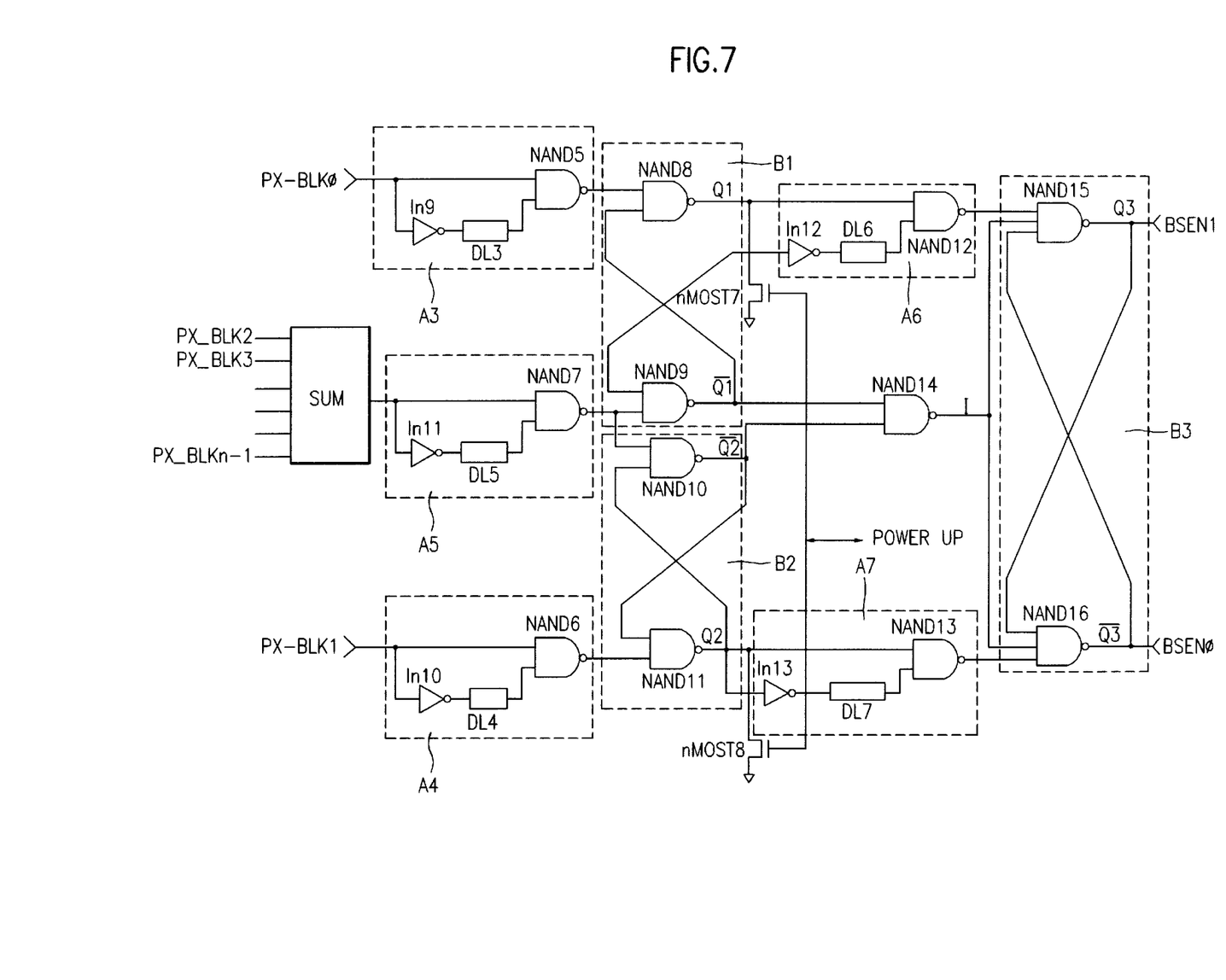
FIG. 7 is a detailed circuit diagram of the block selecting circuit of FIG. 6.
Figure 8:
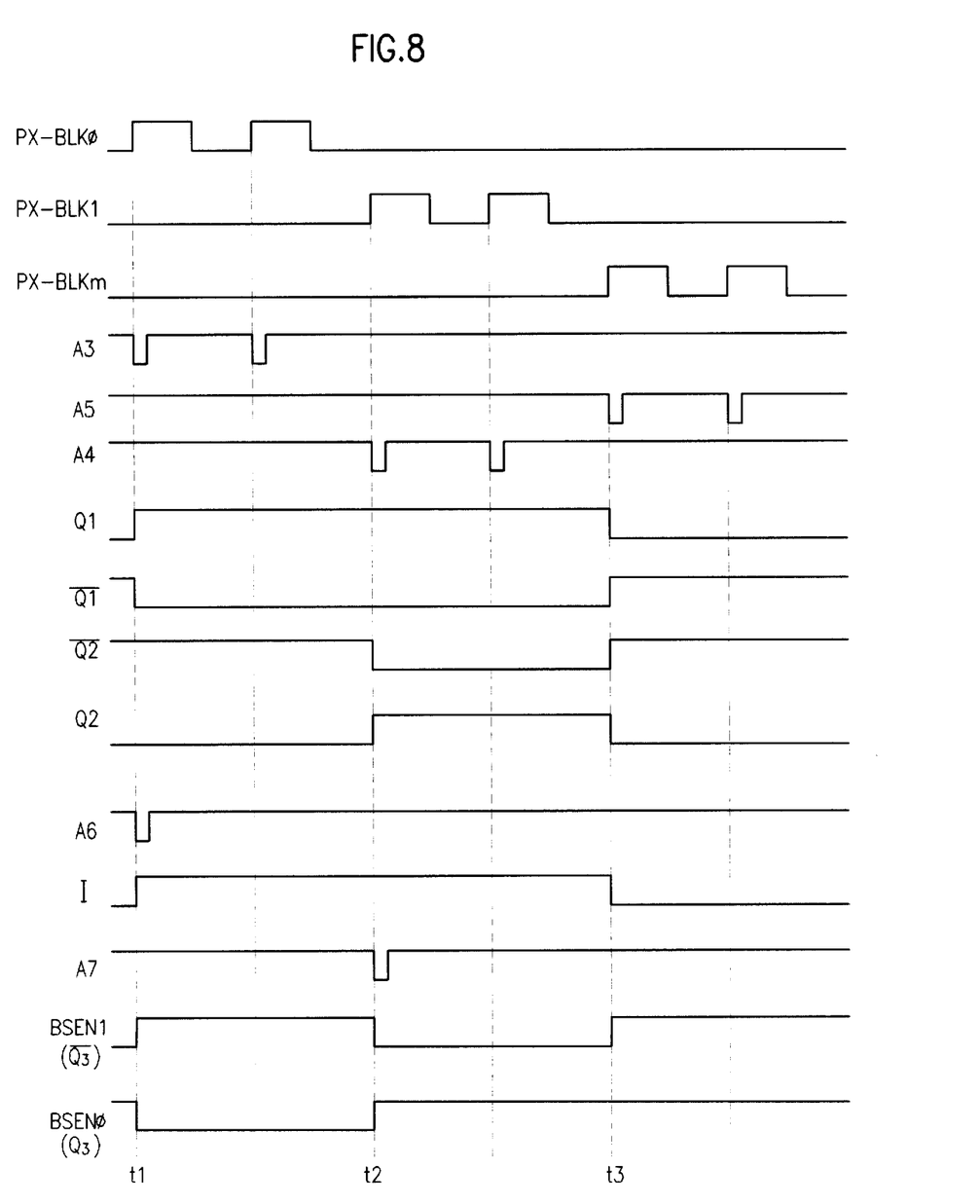
FIG. 8 is a timing diagram corresponding to the second embodiment of the invention.

FIG. 6 illustrates a second preferred embodiment of the present invention. FIG. 7 is a detailed diagram of the block selection circuit of FIG. 6. FIG. 8 is a timing diagram corresponding to the second embodiment of the invention.

Differences between the first and the second embodiments are as follows. The first embodiment concerns a DRAM bit line selection circuit which has an array cell divided into two blocks sharing a bidirectional sense amplifier. The second embodiment concerns a DRAM bit line selection circuit which has its array cell divided into at least four blocks. The first and second blocks share a bidirectional sense amplifier, and either one of the blocks may be selected. The rest of the blocks (at least two blocks) are unselected, and do not commonly share the bidirectional sense amplifier.

As shown in FIG. 6, similar to the configuration of the first embodiment, the bit line selection circuit of the second embodiment includes a block selecting circuit 101, a level transition unit 201, and a bit line selecting signal generating unit 301.

As shown in FIG. 7, the block selecting circuit includes a first pulse generating circuit A3 which has an inverter In9, a delay circuit DL3, and an NAND gate NAND5 for generating a pulse after receiving the block selection coding signal PX-BLK0 of the first block. A second pulse generating circuit A4 includes an inverter In10, a delay circuit DL4, and an NAND gate NAND6 for generating a pulse after receiving the block selection coding signal PX-BLK1 of the second block. A third pulse generating circuit A5 includes an inverter In11, a delay circuit DL5, and an NAND gate NAND7 for generating a pulse after receiving a sum output in the form of an O-ring for summing the block selection coding signals (PX-BLK2 to PX-BLKn–1) of the third through the nth blocks. The third through the nth blocks do not share the bidirectional sense amplifier with the first and second blocks.

A first latching circuit B1 includes NAND gates NAND8 and NAND9 for generating outputs Q1 and $\overline{Q1}$ after receiving and latching the outputs of the first and third pulse generating circuits A3 and A5. A second latching circuit B2 includes NAND gates NAND10 and NAND11 for generating outputs Q2 and $\overline{Q2}$ after receiving and latching the outputs of the second and third pulse generating circuits A4 and A5.

A fourth pulse generating circuit A6 includes an inverter In12, a delay circuit DL6, and an NAND gate NAND12 for generating a pulse after receiving the output Q1 from the first latching circuit B1. A fifth pulse generating circuit A7 includes an inverter In13, a delay circuit DL7, and an NAND gate NAND13 for generating a pulse after receiving the output Q2 from the second latching circuit B2. An NAND gate NAND14 receives the output $\overline{Q1}$ of the first latching circuit B1 and the output $\overline{Q2}$ of the second latching circuit B2, and then performs an NAND logic operation.

A third latching circuit B3 receives the output of the NAND gate NAND14 as its enabling signal, latches the outputs of the fourth and fifth pulse generating circuits A6 and A7, and then generates the block selecting signals BSEN1 and BSEN0.

The nMOS transistors nMOST7 and nMOST8 are provided to receive the power up signal and reset the first and second latching circuits B1 and B2.

As shown in FIG. 6, the level transition unit includes the level shifters LS5 and LS6 which change the voltage from Vcc level to Vpp level, or Vpp level to Vcc level in response to the block selecting signals BSEN1 and BSEN0 of the third latching circuit B3.

The bit line selecting signal generating unit includes an AND gate AND2 performing an AND operation with the outputs of the two level shifters LS5 and LS6. A pair of nMOS transistors nMOST9 and nMOST10 are triggered by the output of the AND gate AND2. Two PMOS transistors PMOST5 and PMOST6 are triggered by the outputs of the level shifters LS5 and LS6, respectively, and two nMOS transistors nMOST11 and nMOST12 are triggered by the inverted output signals of the level shifters LS6 and LS5 (inverted by the inverter In15 and In14), respectively. The drain and source terminals of the nMOS transistors nMOST9 and nMOST10 are respectively connected to the power terminal Vcc and the terminal outputting the bit line selecting signals BS0 and BS1.

The operation of the second preferred embodiment will now be described with reference to the timing diagram illustrated in FIG. 8.

First, it is assumed that the first block, which shares the bidirectional sense amplifier, is selected first. When the first and second blocks proceed from the stand-by mode to the selection mode, the nMOS transistors nMOST7 and nMOST8 (FIG. 7) are turned on by the power up signal and therefore reset the outputs Q1 and Q2 of the first and second latching circuits B1 and B2 at a low level, respectively. At this point, once the first block is selected, the block selection coding signal of the first block (PX-BLK0) generates the output in response to the row address signal /RAS, and the block selection coding signals (PX-BLK1 to PX-BLKn−1) of the other blocks (in FIG. 8, they are marked as PX-BLKm representing blocks PX-BLK2 through PX-BLKn−1, not including PX-BLK1) are at a low level.

Accordingly, because only the first pulse generating circuit A3 generates a negative pulse, the output Q1 of the first latching circuit B1 changes from a low level to a high level, and the output $\overline{Q1}$ changes from a high level to a low level. Thus, the fourth pulse generating circuit A6 generates a negative pulse, causing the output Q3 of the third latching circuit B3 to be at a high level, and the output $\overline{Q3}$ to be at a low level. Accordingly, the third latching circuit B3 outputs the block selecting signal BSEN0 at a low level and BSEN1 at a high level. As shown in FIG. 6, the output of the level shifter LS5 of the level transition unit is at Vcc level and the output of the level shifter LS6 is at Vpp level. As a result, the AND gate AND2 becomes a low level, thereby turning off the nMOS transistors nMOST9 and nMOST10. Simultaneously, the Vcc level output of the level shifter LS6 turns off the PMOS transistor PMOST6 and nMOS transistor nMOST11 through the inverter In15, and the Vpp level output of the level shifter LS5 respectively turns on the PMOS transistor PMOST5 and nMOS transistor nMOST12 through the inverter In14. Therefore, the bit line selecting signal BS0 is at the Vpp level and BS1 is at the Vss level. The first block of the array cell is selected by the BS0 signal of the Vpp level.

Subsequently, as shown in FIG. 8, the second block sharing the bidirectional sense amplifier is selected at a time t2. As a result, only the block selecting signal PX-BLK1 generates the pulse output in response to the row address signal /RAS. When other block selection coding signals PX-BLK0, PX-BLK2 to PX-BLKn−1 are at a low level, the second pulse generating circuit A4 of the block selecting circuit generates a negative pulse so that the outputs Q2 and $\overline{Q2}$ of the second latching circuit B2 change respectively to a high level and a low level. By changing output Q2 to a high level, the fifth pulse generating circuit A7 generates a negative pulse, causing the block selecting signal BSEN0 of the third latching circuit B3 to change to a high level and BSEN1 to a low level. Then, through the same routine as illustrated above, the bit line selecting signal BS0 is at a low level, BS1 is at a high level, and the second block of the array cell to which the BS1 is connected is coupled to the sense amplifier 12.

Thereafter, a third block of the array cell which does not share the bidirectional sense amplifier is selected at a time t3. The output of the sum of the block selecting circuit changes from a low level to a high level by adding the address of the block selection coding signal PX-BLKm. As the third pulse generating circuit A5 generates a negative pulse, the outputs Q1 and $\overline{Q1}$ of the first latching circuit B1 change respectively to a low level and high level, and the outputs Q2 and $\overline{Q2}$ of the second latching circuit B2 change respectively to a low level and high level.

As a result, the output I of the NAND gate NAND14 is at a low level, causing the outputs BSEN0 and BSEN1 of the NAND gates NAND15 and NAND16 of the third latching circuit B3 to be at a high level. As the level shifters LS5 and LS6 (FIG. 6) change respectively from the Vcc level to the Vpp level because of the outputs BSEN0 and BSEN1, the nMOS transistors nMOST9 and nMOST10 are turned on through the AND gate AND2, and the PMOS transistors PMOST5 and PMOST6 and nMOS transistors nMOST11 and nMOST12 are simultaneously turned off. As a result, the bit selecting signal BS0 and BS1 are both precharged at the Vcc level. In other words, BS0 and BS1 are not at a high level of Vpp when the other blocks (which do not share the bidirectional sense amplifier) are selected.

According to the second embodiment of the invention, when either of the first and second blocks sharing the bidirectional sense amplifier is selected, BS0 and BS1 maintain at a Vpp level and a Vss level respectively (or vice versa), regardless of the row address signal /RAS. This stays true until a third block (from the group of the third through the nth block) which does not share the bidirectional sense amplifier is selected. As a result, the power leakage due to the level transition is prevented, similar to the first embodiment. In addition, when such a third block is selected, the BS0 and BS1 are at a precharged state of Vcc level, thereby becoming a stabler state.

Accordingly, the present invention provides a DRAM bit line selecting circuit (using a bidirectional sense amplifier) which maintains the state of a voltage level when the same block is continuously selected, thereby reducing power which is consumed in a level transition step.

It will be apparent to those skilled in the art that various modifications and variations can be made in the low-power consumption DRAM bit line selection circuit of the present invention without departing from the spirit or scope of the invention. Thus, it is intended that the present invention cover the modifications and variations of this invention provided they come within the scope of the appended claims and their equivalents.

What is claimed is:

1. A DRAM bit line selection circuit for selecting multiple pairs of bit lines connecting a bidirectional sense amplifier and a cell array having at least two blocks, the bit line selection circuit comprising:

a block selecting circuit for receiving block selection coding signals corresponding to each block, generating a first signal corresponding to a selected block and a second signal corresponding to a non-selected block, and maintaining the first signal and the second signal until a non-selected block is selected;

a level transition unit for outputting a transition signal having one of a first level (Vpp) and a second level (Vcc) in response to an output from the block selecting circuit; and a bit line selecting signal generating unit for generating a bit line selecting signal in response to the transition signal of the level transition unit, wherein the bit line selecting signal corresponding to the selected block maintains the first level (Vpp), and changes to a third level (Vss) when the non-selected block is selected;

wherein the first level (Vpp) is greater or equal to a sum of the second level (Vcc) and a threshold voltage of PMOS and nMOS transistors (Vth), and the third level (Vss) is lower than the second level (Vcc).

2. The circuit as claimed in claim 1, wherein the block selecting circuit includes:

a first pulse generating unit for receiving a block selection coding signal of a first block and generating a pulse signal;

a second pulse generating unit for receiving a block selection coding signal of a second block and generating a pulse signal, wherein the first block and the second block sharing the bidirectional sense amplifier; and a first latching unit for receiving and latching the pulse signals of the first and second pulse generating units;

wherein the bit line selecting signal corresponding to the block selection coding signal of the selected block maintaining the first level and a bit line selecting signal output corresponding to the block selection coding signal of the non-selected block maintaining the third level.

3. The circuit as claimed in claim 2, wherein each of the first and second pulse generating unit includes an NAND gate having a first input terminal and a second input terminal, the first input terminal coupling with one of the block selection coding signals, the second input terminal coupling with the one of the block selection coding signals applied via an inverter and a delay circuit.

4. The circuit as claimed in claim 2, wherein the first latching unit includes an NAND gate type latching circuit for latching the pulse signal of the first pulse generating unit generated by the block selection coding signal of the first block, and then maintaining the latching state until the pulse signal corresponding to the block selection coding signal of the second block is generated.

5. The circuit as claimed in claim 1, wherein the level transition unit includes a first level shifter and a second level shifter.

6. The circuit as claimed in claim 5, wherein the bit line selecting signal generating unit includes:

a first PMOS transistor whose gate is connected via an inverter to the first level shifter;

a first nMOS transistor whose gate is connected via two serial inverters to the second level shifter;

a second nMOS transistor whose gate is connected via two serial inverters to the first level shifter; and a second PMOS transistor whose gate is connected through an inverter to the second level shifter.

7. The circuit as claimed in claim 1, wherein a first block and a second block share the bidirectional sense amplifier, a third block through a nth block do not share the bidirectional sense amplifier, n being an integer larger than three (3) the block selecting circuit comprises:

a first pulse generating unit for receiving a block selection coding signal of the first block and generating a pulse;

a second pulse generating unit for adding at least two block selection coding signals of the third through nth blocks with an adding unit, and then generating a pulse by using an output of the adding unit;

a third pulse generating unit for receiving a block selection coding signal of the second block and generating a pulse;

a first latching unit for receiving and respectively latching the pulses of the first and second pulse generating units;

a second latching unit for receiving and respectively latching the pulses of the second and third pulse generating units;

a fourth pulse generating unit for receiving a first latching output of the first latching unit and then generating a pulse;

a fifth pulse generating unit for receiving a first latching output of the second latching unit and then generating a pulse;

a logic circuit for performing a logic operation by receiving a second latch output of the first latching unit and a second latch output of the second latching unit; and a third latching unit for taking an output of the logic circuit as an enable input, and taking the pulses of the fourth and fifth pulse generating units as data inputs, and latching the data inputs.

8. The circuit as claimed in claim 7, wherein the first through fifth pulse generating units each includes an NAND gate having a first input terminal and a second input terminal, the first input terminal coupling with an input signal, the second input terminal coupling with the input signal applied via an inverter and a delay circuit.

9. The circuit as claimed in claim 7, wherein the first, second, and third latching units each includes an NAND gate type latching circuit, respectively.

10. The circuit as claimed in claim 7, wherein the adding unit includes an O-ring.

11. The circuit as claimed in claim 7, wherein the logic circuit includes an NAND gate.

12. The circuit as claimed in claim 7, wherein the level transition unit include a first and a second level shifters.

13. The circuit as claimed in claim 12, wherein the bit line selecting signal generating unit comprises:

an AND gate performing a logic operation after receiving output signals of the first and second level shifters;

a first nMOS transistor and a second nMOS transistor triggered by an output of the AND gate;

a third nMOS transistor triggered by the output of the second level shifter applied via an inverter;

a first PMOS transistor triggered by the output of the first level shifter;

a fourth nMOS transistor triggered by the output of the first level shifter applied via an inverter; and a second PMOS transistor triggered by the output of the second level shifter;

wherein a bit line selecting signal of the first level or the third level being output by the block selection coding signals of the first and second blocks, and a bit line selecting signal of the second level being output by the block selecting signals of the third through nth blocks.

14. The DRAM bit line selection circuit as claimed in claim 1, wherein only a first block and a second block share the bidirectional sense amplifier, the bit line selecting signal corresponding to the first and second block maintaining at the first and third level respectively when one of the first and second blocks is selected, the bit line selecting signal corresponding to a third block maintaining at the second level when the third block is selected.

15. A DRAM sensing system comprising:

a bidirectional sense amplifier;

a cell array divided into at least two blocks;

a switching unit and multiple pairs of bit lines coupling the bidirectional sense amplifier and the cell array; and a bit line selection circuit for driving the switching unit and the multiple pairs of bit lines, the bit line selection circuit including:

a block selecting circuit for receiving block selection coding signals corresponding to each block, generating a signal of high level corresponding to a selected block and a signal of low level corresponding to a non-selected block, and maintaining the signal of high level and the signal of low level until a non-selected block is selected,     a level transition unit for outputting a transition signal having one of a first level (Vpp) and a second level (Vcc) in response to an output from the block selecting circuit, and     a bit line selecting signal generating unit for generating a bit line selecting signal in response to the transition signal of the level transition unit, wherein the bit line selecting signal corresponding to the selected block maintains the first level (Vpp), and changes to a third level (Vss) when the non-selected block is selected;

wherein the first level (Vpp) is greater or equal to a sum of the second level (Vcc) and a threshold voltage of PMOS and nMOS transistors (Vth), and the third level (Vss) is lower than the second level (Vcc).

16. A bit line selection circuit for a DRAM having a cell array divided into first and second blocks, comprising:

a block selecting circuit having first and second pulse generating units and a latch unit, the block selecting circuit providing first and second signals, wherein the first signal corresponds to the first block which is selected and the second signal corresponds to the second block which is not selected;

a level transition unit receiving the first and second signals of the block selecting circuit, the level transition unit outputting one of first and second signal levels in response to the first and second signals;

a bit line selecting signal generating unit receiving the first and second signal levels from the level transition unit and providing first and second bit line selecting signals, the first and second bit line selecting signals maintaining one of the first and a third signal levels until the second block is selected by the block selecting circuit;

wherein the first level is greater or equal to a sum of the second level and a threshold voltage of PMOS and nMOS transistors, and the third level is lower than the second level.

17. A DRAM bit line selection circuit for selecting multiple pairs of bit lines connecting a bidirectional sense amplifier and a cell array divided into at least two blocks, the bit line selection circuit comprising:

a block selecting circuit including:

first and second pulse generating units for receiving block selection coding signals and generating pulse signals, and     a signal level latching unit for selecting a pulse signal from one of the first and second pulse generating units corresponding to a first block which is selected, the signal level latching unit latching the selected pulse signal until a second block is selected;

a level transition unit for outputting a transition signal having one of a first level and a second level in response to an output of the block selection circuit; and a bit line selecting signal generating unit for outputting a bit line selecting signal in response to the transition signal of the level transition unit, the bit line selecting signal maintaining the first level or a third level when the first block is selected and until the second block is selected;

wherein the first level is greater or equal to a sum of the second level and a threshold voltage of PMOS and nMOS transistors, and the third level is lower than the second level.

\* \* \* \* \*